(12) United States Patent
Spindler et al.

(10) Patent No.: US 7,977,872 B2
(45) Date of Patent: Jul. 12, 2011

(54) HIGH-COLOR-TEMPERATURE TANDEM WHITE OLED

(75) Inventors: Jeffrey P. Spindler, Rochester, NY (US); Tukaram K. Hatwar, Penfield, NY (US)

(73) Assignee: Global OLED Technology LLC, Herndon, VA (US)

(*) Notice: Subject to any disclaimer, the term of this patent is extended or adjusted under 35 U.S.C. 154(b) by 378 days.

(21) Appl. No.: 12/211,560

(22) Filed: Sep. 16, 2008

(65) Prior Publication Data

US 2010/0066239 A1   Mar. 18, 2010

(51) Int. Cl.
*H01L 51/52* (2006.01)

(52) U.S. Cl. .................................. 313/506; 313/504

(58) Field of Classification Search .............. 257/40, 257/72, 98–100, 642–643, 759; 313/498.512; 315/169.1, 169.3; 427/58, 64, 66, 532–535, 427/539; 428/690–691, 917; 438/26–29, 438/34, 82; 445/24–25
See application file for complete search history.

(56) References Cited

U.S. PATENT DOCUMENTS

| | | | |
|---|---|---|---|
| 4,769,292 A | 9/1988 | Tang et al. | |
| 4,885,211 A | 12/1989 | Tang et al. | |
| 5,503,910 A | 4/1996 | Matsuura et al. | |
| 5,683,823 A | 11/1997 | Shi et al. | |
| 6,107,734 A | 8/2000 | Tanaka et al. | |
| 6,337,492 B1 | 1/2002 | Jones et al. | |
| 6,717,358 B1 | 4/2004 | Liao et al. | |
| 2003/0170491 A1 | 9/2003 | Liao et al. | |
| 2003/0189401 A1 | 10/2003 | Kido et al. | |
| 2006/0006797 A1 | 1/2006 | Ito et al. | |
| 2006/0186793 A1 | 8/2006 | Iou | |
| 2007/0001588 A1 | 1/2007 | Boroson et al. | |

FOREIGN PATENT DOCUMENTS

| | | |
|---|---|---|
| EP | 1 408 563 | 4/2004 |
| JP | 07-142169 | 6/1995 |
| JP | 2003-045676 | 2/2003 |
| WO | WO 2005/109541 | 11/2005 |

OTHER PUBLICATIONS

High-Efficiency White Phosphorescent Organic Light-emitting Devices with Greenish-Blue and Red-Emitting Lyaers, Applied Physics Letter, vol. 83, No. 12, Sep. 22, 2003, pp. 2459-2462.

(Continued)

*Primary Examiner* — Nimeshkumar D Patel
*Assistant Examiner* — Donald L Raleigh
(74) *Attorney, Agent, or Firm* — Morgan, Lewis & Bockius LLP

(57) ABSTRACT

An OLED device having two spaced electrodes including: first, second, and third light-emitting units disposed between the electrodes, the first light-emitting unit produces light that has multiple peaks at wavelengths longer than 500 nm and substantially no emission at wavelengths shorter than 480 nm, and the second and third light-emitting units produce light that has substantial emission at wavelengths shorter than 500 nm; intermediate connectors respectively disposed between the first and second light-emitting units, and between the second and third light-emitting units; and wherein the OLED device emits light with a color temperature greater than 7,000K.

12 Claims, 3 Drawing Sheets

OTHER PUBLICATIONS 27.5L: Late-News Paper: Multiphoton Organic EL Device having Charge Generation Layer, T. Matsumoto, T. Nakada, J. Endo, K. Mori, N. Kawarmura and A. Yokoi, SID 2003 Digest, pp. 979-981.

White-Light-Emitting Organic Electroluminescent Devices Based on Interlayer Sequential Energy Transfer, R. S. Deshpande, V. Bulovic, and S.R. Forrest, Applied Physics Letters, vol. 75, No. 7, Aug. 16, 1999, p. 888-817.

White Light-emitting Organic Electroluminescent Devices using the poly(N-vinycarbazole) emitter layer doped with three fluorescent dyes, J. Kido, K. Hongawa, K. Okuyama, and K. Nagai, Applied Physics Letters, 64 (7), Feb. 14 1994, p. 815-817.

HIGH-COLOR-TEMPERATURE TANDEM WHITE OLED

CROSS REFERENCE TO RELATED APPLICATIONS

Reference is made to commonly assigned U.S. Pat. No. 7,332,860, entitled EFFICIENT WHITE-LIGHT OLED DISPLAY WITH FILTERS by Hatwar et al.; U.S. patent application Ser. No. 11/749,883, entitled HYBRID OLED WITH FLUORESCENT AND PHOSPHORESCENT LAYERS by Deaton et al.; and U.S. patent application Ser. No. 11/749,899, entitled HYBRID FLUORESCENT/PHOSPHORESCENT OLEDS by Deaton et al.; the disclosures of which are incorporated herein by reference.

FIELD OF THE INVENTION

The present invention relates to broadband light-producing OLED displays suitable for large displays.

BACKGROUND OF THE INVENTION

An organic light-emitting diode device, also called an OLED, commonly includes an anode, a cathode, and an organic electroluminescent (EL) unit sandwiched between the anode and the cathode. The organic EL unit includes at least a hole-transporting layer (HTL), a light-emitting layer (LEL), and an electron-transporting layer (ETL). OLEDs are attractive because of their low drive voltage, high luminance, wide viewing-angle, and capability for full color displays and for other applications. Tang et al. described this multilayer OLED in their U.S. Pat. Nos. 4,769,292 and 4,885,211.

OLEDs can emit different colors, such as red, green, blue, or white, depending on the emitting property of its LEL. Recently, there is an increasing demand for broadband OLEDs to be incorporated into various applications, such as a solid-state lighting source, color display, or a full color display. By broadband emission, it is meant that an OLED emits sufficiently broad light throughout the visible spectrum so that such light can be used in conjunction with filters or color change modules to produce displays with at least two different colors or a full color display. In particular, there is a need for broadband-light-emitting OLEDs (or broadband OLEDs) where there is substantial emission in the red, green, and blue portions of the spectrum, i.e., a white-light-emitting OLED (white OLED). The use of white OLEDs with color filters provides a simpler manufacturing process than an OLED having separately patterned red, green, and blue emitters. This can result in higher throughput, increased yield, and cost savings. White OLEDs have been reported, e.g. by Kido et al. in *Applied Physics Letters*, 64, 815 (1994), J. Shi et al. in U.S. Pat. No. 5,683,823, Sato et al. in JP 07-142169, Deshpande et al. in *Applied Physics Letters*, 75, 888 (1999), and Tokito, et al. in *Applied Physics Letters*, 83, 2459 (2003).

In order to achieve broadband emission from an OLED, more than one type of molecule has to be excited, because each type of molecule only emits light with a relatively narrow spectrum under normal conditions. A light-emitting layer having a host material and one or more luminescent dopant(s) can achieve light emission from both the host and the dopant(s) resulting in a broadband emission in the visible spectrum if the energy transfer from the host material to the dopant(s) is incomplete. To achieve a white OLED having a single light-emitting layer, the concentrations of light-emitting dopants must be carefully controlled. This produces manufacturing difficulties. A white OLED having two or more light-emitting layers can have better color and better luminance efficiency than a device with one light-emitting layer, and the variability tolerance for dopant concentration is higher. It has also been found that white OLEDs having two light-emitting layers are typically more stable than OLEDs having a single light-emitting layer. However, it is difficult to achieve light emission with strong intensity in the red, green, and blue portions of the spectrum. A white OLED with two light-emitting layers typically has two intensive emission peaks.

A tandem OLED structure (sometimes called a stacked OLED or a cascaded OLED) has been disclosed by Jones et al. in U.S. Pat. No. 6,337,492, Tanaka et al. in U.S. Pat. No. 6,107,734, Kido et al. in JP Patent Publication 2003/045676A and U.S. Patent Publication 2003/0189401 A1, and Liao et al. in U.S. Pat. No. 6,717,358 and U.S. Patent Publication 2003/0170491 A1. This tandem OLED is fabricated by stacking several individual OLED units vertically and driving the stack using a single power source. The advantage is that luminance efficiency, lifetime, or both are increased. However, the tandem structure increases the driving voltage approximately in proportion to the number of OLED units stacked together.

Matsumoto and Kido et al. reported in *SID 03 Digest*, 979 (2003) that a tandem white OLED is constructed by connecting a greenish blue EL unit and an orange EL unit in the device, and white light emission is achieved by driving this device with a single power source. Although luminance efficiency is increased, this tandem white OLED device has weaker green and red color components in the spectrum. In U.S. Patent Publication 2003/0170491 A1, Liao et al. describe a tandem white OLED structure by connecting a red EL unit, a green EL unit, and a blue EL unit in series within the device. When the tandem white OLED is driven by a single power source, white light emission is formed by spectral combination from the red, green, and blue EL units.

Notwithstanding these developments, there remains a need to improve efficiency and luminance stability of OLED devices while maintaining good broadband emission. Further, much work has been done to produce OLED displays having a broadband emission near the color of CIE Standard Illuminant $D_{65}$, which has a color temperature of approximately 6500K. Many commercially available liquid-crystal and plasma displays are set with a color temperature of 9300K or above, which is a much bluer white. Thus, there is also a need to produce efficient and stable OLED displays with a higher color temperature.

SUMMARY OF THE INVENTION

There is a need for OLED devices with improved color temperature, efficiency, and luminance stability.

This object is achieved by an OLED device having two spaced electrodes comprising:

a. first, second, and third light-emitting units disposed between the electrodes, the first light-emitting unit produces light that has multiple peaks at wavelengths longer than 500 nm and substantially no emission at wavelengths shorter than 480 nm, and the second and third light-emitting units produce light that has substantial emission at wavelengths shorter than 500 nm;

b. intermediate connectors respectively disposed between the first and second light-emitting units, and between the second and third light-emitting units; and c. wherein the OLED device emits light with a color temperature greater than 7,000K.

ADVANTAGES

It is an advantage of this invention that it provides an OLED display with an improved color temperature for larger displays and with improved efficiency and lifetime.

Figure 1:
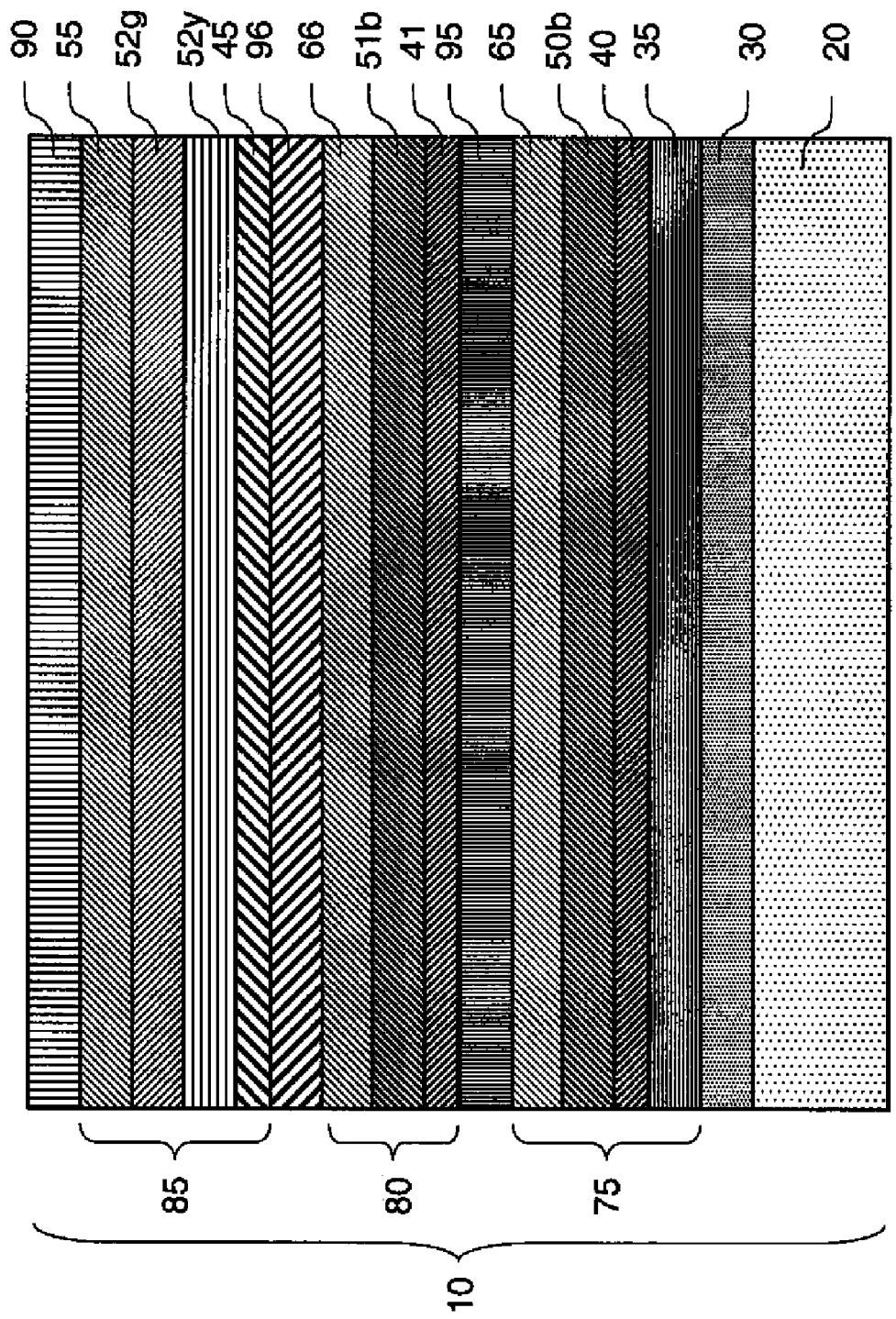
FIG. 1 shows a cross-sectional view of one embodiment of a tandem OLED device in accordance with this invention.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED device" is used in its art-recognized meaning of a display device comprising organic light-emitting diodes as pixels. It can mean a device having a single pixel. The terms "tandem OLED device" and "stacked OLED device" mean an OLED device comprising two or more light-emitting units arranged vertically, wherein each light-emitting unit is capable of light-emission independently of the others. Each light-emitting unit includes at least a hole-transporting layer, a light-emitting layer, and an electron-transporting layer. The light-emitting units are separated by intermediate connectors. The term "OLED display" as used herein means an OLED device comprising a plurality of pixels, which can be of different colors. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any combination of hues. The red, green, and blue colors constitute the three primary colors from which all other colors can be generated by appropriate mixing. The term "hue" refers to the intensity profile of light emission within the visible spectrum, with different hues exhibiting visually discernible differences in color. The term "pixel" is employed in its art-recognized usage to designate an area of a display panel that is stimulated to emit light independently of other areas. It is recognized that in full color systems, several pixels of different colors will be used together to produce a wide range of colors, and a viewer can term such a group a single pixel. For the purposes of this discussion, such a group will be considered several different colored pixels.

In accordance with this disclosure, broadband emission is light that has significant components in multiple portions of the visible spectrum, for example, blue and green. Broadband emission can also include the situation where light is emitted in the red, green, and blue portions of the spectrum in order to produce white light. White light is that light that is perceived by a user as having a white color, or light that has an emission spectrum sufficient to be used in combination with color filters to produce a practical full color display. For low power consumption, it is often advantageous for the chromaticity of the white-light-emitting OLED to be close to CIE Standard Illuminant $D_{65}$, i.e. 1931 CIE chromaticity coordinates of CIEx=0.31 and CIEy=0.33. This is particularly the case for so-called RGBW displays having red, green, blue, and white pixels. Although CIEx, CIEy coordinates of about 0.31, 0.33 are ideal in some circumstances, the actual coordinates can vary significantly and still be very useful. For some applications, such as televisions and other large displays, it can be desirable to have a white emission with a higher color temperature, which means a more blue emission than $D_{65}$. Color temperature is the equivalent temperature of a light source of a heated subject called a "black body" and is expressed on an absolute temperature scale in degrees Kelvin. Furthermore, the correlated color temperature, or CCT, is defined as the value of the temperature of the black body radiator when the radiator color matches that of the light source, but does not imply a spectral match. (A. R. Robertson, "Computation of Correlated Color Temperature and Distribution Temperature," J. Opt. Soc. Am. 58, 1528-1535 (1968)). The term "color temperature" as used in this application actually refers to the correlated color temperature. As the white emission becomes bluer, the color temperature increases. For such displays, a desirable white emission can have CIE coordinates of 0.25 to 0.30 for both CIEx and CIEy. Preferably, the white emission would have CIE coordinates of x=0.28 and y=0.29, corresponding to a color temperature of 10,000K. One method of producing a bluer white is to increase the average intensity of the blue pixels of the display. However, this would have the deleterious effect of reducing the lifetimes of the blue pixels. The term "white-light-emitting" as used herein refers to a device that produces white light internally, even though part of such light can be removed by color filters before viewing.

Turning now to FIG. 1, there is shown a cross-sectional view of a pixel of a tandem white-light-emitting OLED device 10 according to one embodiment of the present invention. OLED device 10 includes a substrate 20, two spaced electrodes, which are anode 30 and cathode 90, first, second, and third light-emitting units 85, 80, and 75, respectively, disposed between the electrodes, intermediate connector 96 disposed between first and second light-emitting units 85 and 80, and intermediate connector 95 disposed between second and third light-emitting units 80 and 75. Hatwar et al. in U.S. Pat. No. 7,332,860 has described the use of multiple light-emitting units in a so-called tandem arrangement of this type. First light-emitting unit 85 produces light that has multiple peaks at wavelengths longer than 500 nm, e.g. in the green, yellow, and red regions of the visible spectrum. First light emitting unit 85 produces substantially no blue emission, meaning that the emission intensity at wavelengths shorter than 480 nm is less than 10% of the maximum emission intensity, and no more than 50% at 490 nm. In this embodiment, first light-emitting unit 85 includes a first light-emitting layer, e.g. green light-emitting layer 52g that includes a green light-emitting compound and produces green emission. First light-emitting unit 85 further includes a second light-emitting layer, e.g. yellow light-emitting layer 52y that includes a yellow light-emitting compound and produces emission in the yellow to red portion of the visible spectrum. As used herein, the term "yellow light-emitting compound" refers to a substance that has its primary light emission in the yellow to red region, that is, from about 570 nm to 700 nm. Second and third light-emitting units 80 and 75 produce light that has substantial emission at wavelengths shorter than 500 nm, that is, in the blue portion of the visible spectrum. Second and third light-emitting units 80 and 75 can have emission at other wavelengths as well. Second and third light-emitting units 80 and 75 can have the same emission spectra or different emission spectra. In this embodiment, second and third light-emitting units 80 and 75 each include a blue light-emitting layer, e.g. blue light-emitting layers 51b and 50b, respectively, that includes a blue light-emitting compound. Each light-emitting unit includes an electron-transporting layer, e.g. 55, 66, and 65, and a hole-transporting layer, e.g. 45, 41, and 40. OLED device 10 also includes hole-injecting layer 35.

Tandem OLED device 10 further includes intermediate connectors disposed between the light-emitting units, e.g. intermediate connector 96 disposed between first and second light-emitting units 85 and 80, and intermediate connector 95 disposed between second and third light-emitting units 80 and 75. The intermediate connectors provide effective carrier injection into the adjacent EL units. Metals, metal compounds, or other inorganic compounds are effective for carrier injection. However, such materials often have low resistivity, which can result in pixel crosstalk. Also, the optical transparency of the layers constituting the intermediate connectors should be as high as possible to permit for radiation produced in the EL units to exit the device. Therefore, it is often preferred to use mainly organic materials in the intermediate connectors. Intermediate connectors and materials used in their construction have been described in detail by Hatwar et al. in US Publication 2007/0001587. Some further nonlimiting examples of intermediate connectors are described in U.S. Pat. Nos. 6,717,358 and 6,872,472, and U.S. Patent Publication 2004/0227460 A1.

An OLED device of this construction emits light with a higher color temperature than many prior art devices. An OLED device can be constructed in this way such that the device emits light with a color temperature greater than 7,000K, and usefully with a color temperature between 9,000K and 15,000K. This is a bluer white than the $D_{65}$ point and is suitable and even desirable for larger displays, such as large-screen televisions.

Figure 2:
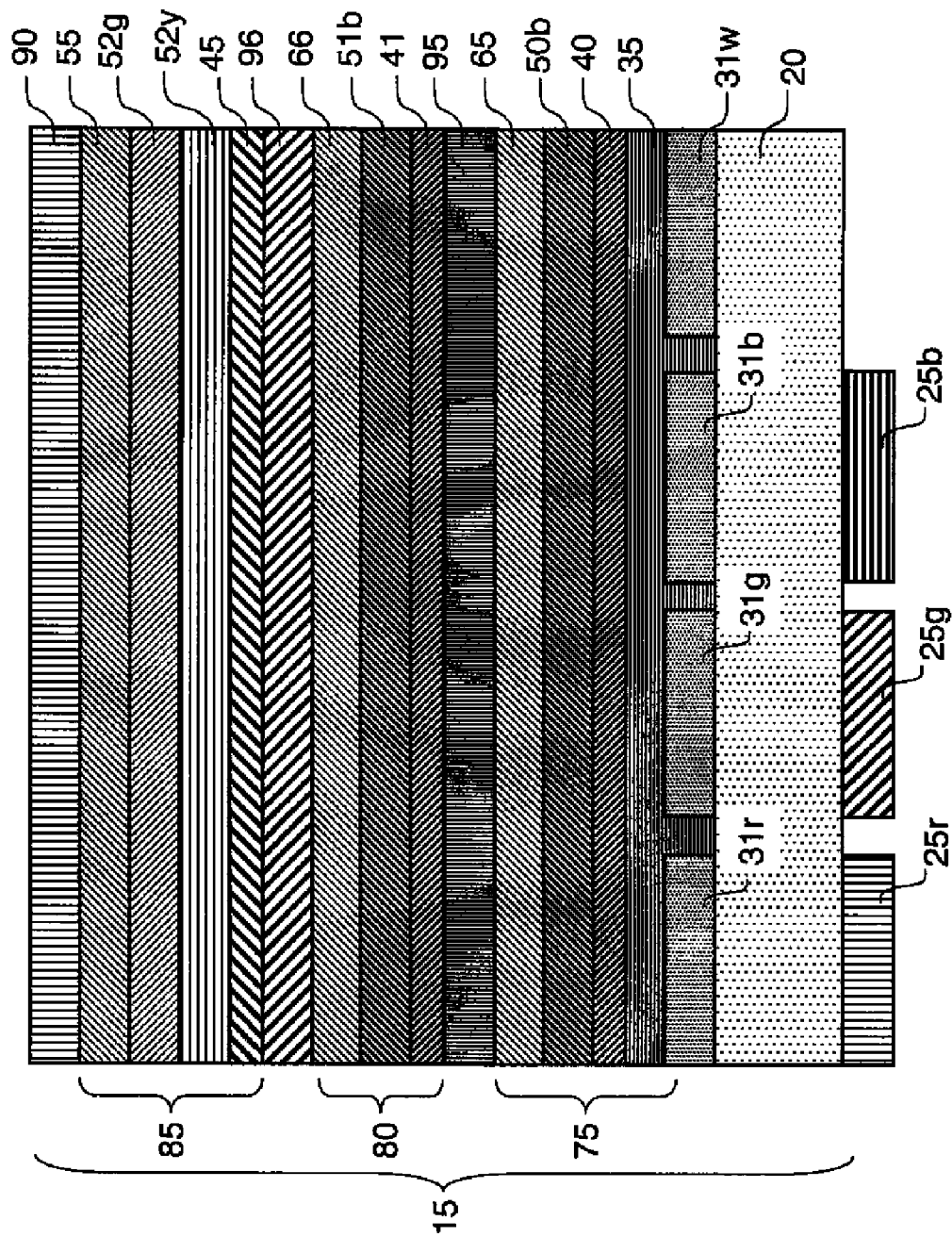
FIG. 2 shows a cross-sectional view of another embodiment of a tandem OLED device in accordance with this invention.

Turning now to FIG. 2, there is shown a cross-sectional view of another embodiment of a tandem OLED device 15 in accordance with this invention. In this embodiment, OLED device 15 further includes associated with it an array of at least three different color filters. The bandpass of each color filter is selected to produce different colored light, e.g. red color filter 25r, green color filter 25g, and blue color filter 25b, which produce red, green, and blue light, respectively. Each color filter of the array receives light from the light-emitting units, e.g. first, second, and third light-emitting units 85, 80, and 75, and thereby produces different colored light through each filter. Each color filter has an associated anode, e.g. anodes 31r, 31g, and 31b, respectively, for selectively producing desired colors of light. OLED device 15 can also have non-filtered areas, e.g. that of anode 31w, which has no color filter and therefore allows emission of broadband light produced by OLED device 15, which can thus form an RGBW device with the array of color filters.

Light-emitting layers such as those described herein produce light in response to hole-electron recombination. Desired organic light-emitting materials can be deposited by any suitable process such as evaporation, sputtering, chemical vapor deposition, electrochemical deposition, or radiation thermal transfer from a donor material. Useful organic light-emitting materials are well known. As more fully described in U.S. Pat. Nos. 4,769,292 and 5,935,721, the light-emitting layers of the OLED device comprise a luminescent or fluorescent material where electroluminescence is produced as a result of electron-hole pair recombination in this region. The light-emitting layers can be comprised of a single material, but more commonly include a host material doped with a guest compound or dopant where light emission comes primarily from the dopant. The dopant is selected to produce color light having a particular spectrum. The host materials in the light-emitting layers can be an electron-transporting material, a hole-transporting material, or another material that supports hole-electron recombination. The dopant is often chosen from highly fluorescent dyes that are generally singlet light-emitting compounds, that is, they emit light from an excited singlet state. However, phosphorescent compounds that are generally triplet light-emitting compounds, that is, they emit light from an excited triplet state, e.g., transition metal complexes as described in WO 98/55561, WO 00/18851, WO 00/57676, and WO 00/70655, are also useful. Dopants are typically coated as 0.01 to 10% by weight into the host material. Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078. Blue light-emitting layer 50b and 51b comprise a host material and a blue-light-emitting dopant. The blue-light-emitting dopant can be a singlet or a triplet light-emitting compound. The light-emitting layers of first light-emitting unit 85, e.g. light-emitting layers 52g and 52y, can include as dopants singlet light-emitting compounds or triplet light-emitting compounds.

Metal complexes of 8-hydroxyquinoline and similar derivatives (Formula A) constitute one class of useful electron-transporting host materials capable of supporting electroluminescence, and are particularly suitable for light emission of wavelengths longer than 500 nm, e.g., green, yellow, orange, and red.

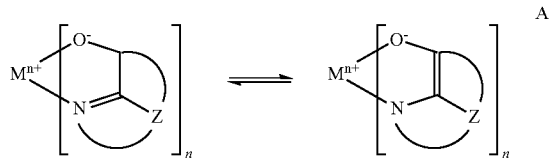

A wherein:
M represents a monovalent, divalent, or trivalent metal;
n is an integer of from 1 to 3; and
Z independently in each occurrence represents the atoms completing a nucleus having at least two fused aromatic rings.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Benzazole derivatives constitute another class of useful host materials capable of supporting electroluminescence, and are particularly suitable for light emission of wavelengths longer than 400 nm, e.g., blue, green, yellow, orange or red. An example of a useful benzazole is 2,2',2"-(1,3,5-phenylene)tris[1-phenyl-1H-benzimidazole].

The host material in one or more of the light-emitting layers of the present invention can include an anthracene derivative having hydrocarbon or substituted hydrocarbon substituents at the 9 and 10 positions. For example, certain derivatives of 9,10-diarylanthracenes (Formula B) are known to constitute a class of useful host materials capable of supporting electroluminescence, and are particularly suitable for light emission of wavelengths longer than 400 nm, e.g., blue, green, yellow, orange or red

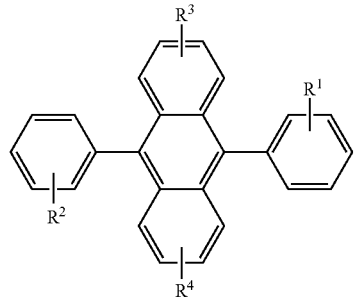

B wherein $R^1$, $R^2$, $R^3$, and $R^4$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Particularly useful are compounds wherein $R^1$ and $R^2$ represent additional aromatic rings. Specific examples of useful anthracene materials for use as a host in a light-emitting layer include:

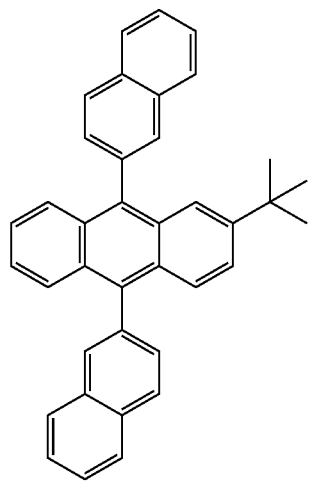

B1

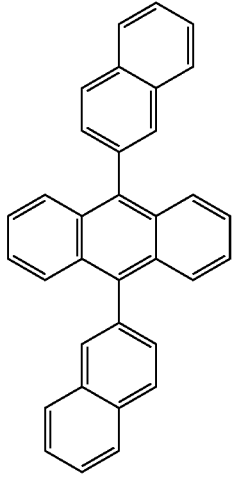

B2

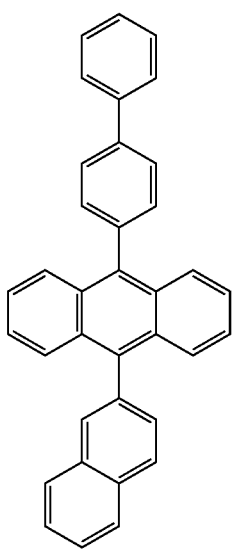

B3

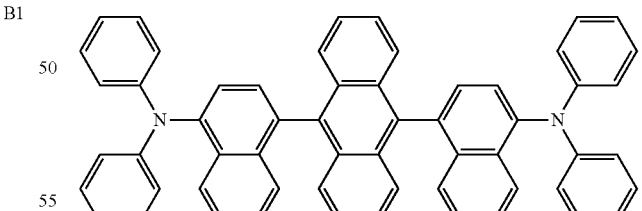

B4

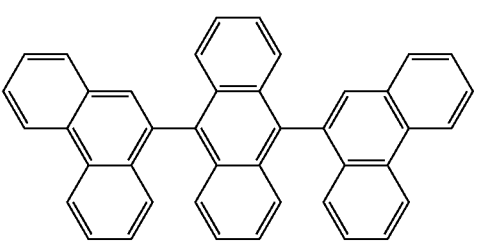

B5

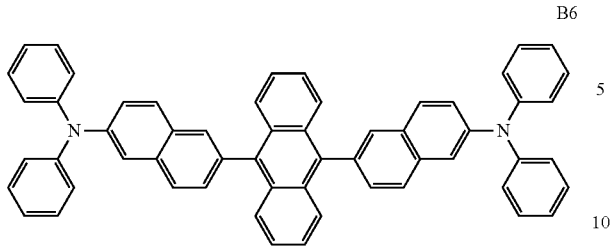
B6

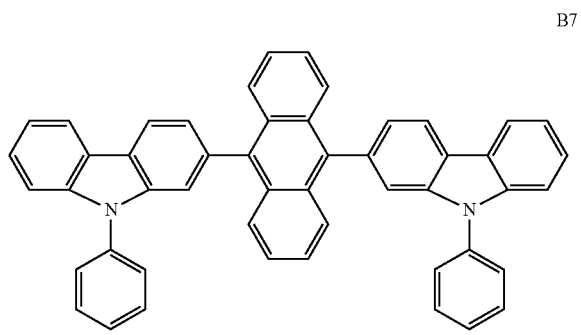
B7

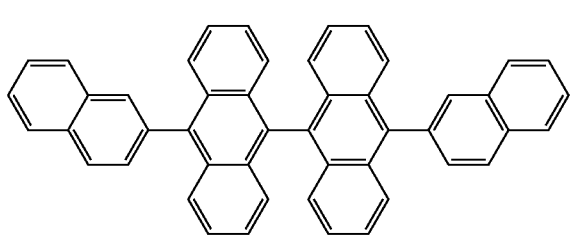
B8

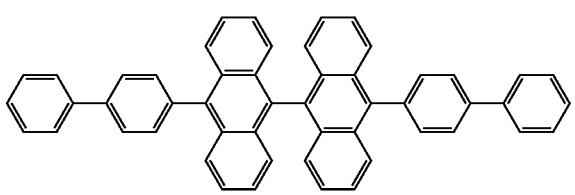
B9

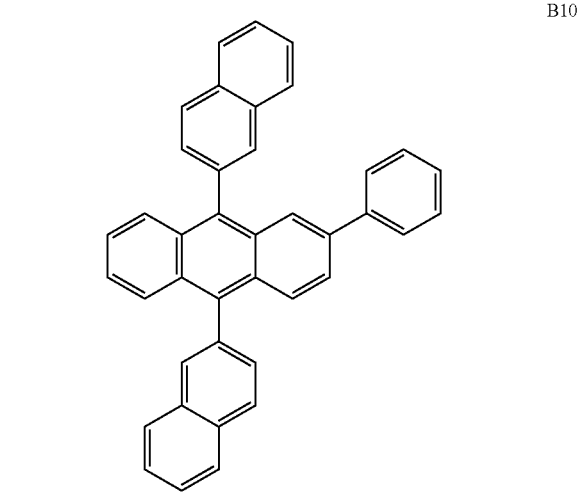
B10

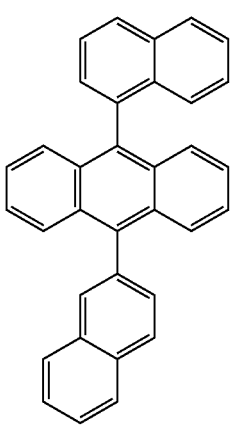
B11

Hole-transporting materials useful as hosts in light-emitting layers are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula C.

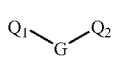
C wherein:
  $Q_1$ and $Q_2$ are independently selected aromatic tertiary amine moieties; and
  G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula C and containing two triarylamine moieties is represented by structural Formula D.

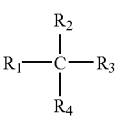
D where:
  $R_1$ and $R_2$ each independently represent a hydrogen atom, an aryl group, or an alkyl group or $R_1$ and $R_2$ together represent the atoms completing a cycloalkyl group; and R₃ and R₄ each independently represent an aryl group, which is in turn substituted with a diaryl substituted amino group, as indicated by structural Formula E.

E wherein R₅ and R₆ are independently selected aryl groups. In one embodiment, at least one of R₅ or R₆ contains a polycyclic fused ring structure, e.g., a naphthalene.

Another class of aromatic tertiary amines are the tetraaryldiamines. Desirable tetraaryldiamines include two diarylamino groups, such as indicated by Formula E, linked through an arylene group. Useful tetraaryldiamines include those represented by Formula F.

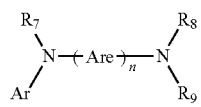

F wherein:
each Are is an independently selected arylene group, such as a phenylene or anthracene moiety;
n is an integer of from 1 to 4; and
Ar, R₇, R₈, and R₉ are independently selected aryl groups.
In a typical embodiment, at least one of Ar, R₇, R₈, and R₉ is a polycyclic fused ring structure, e.g., a naphthalene.

The various alkyl, alkylene, aryl, and arylene moieties of the foregoing structural Formulae C, D, E, and F can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain live, six, or seven carbon atoms—e.g., cyclopentyl, cyclohexyl, and cycloheptyl ring structures. The aryl and arylene moieties are usually phenyl and phenylene moieties.

In addition to a host material as described above, green light-emitting layer 52g also includes a green light-emitting dopant. A singlet green light-emitting dopant can include a quinacridone compound, e.g. a compound of the following structure:

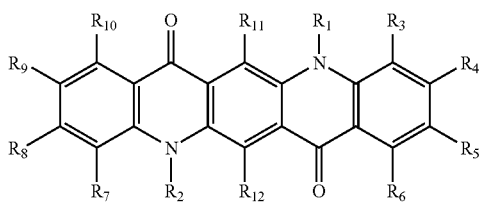

G wherein substituent groups R₁ and R₂ are independently alkyl, alkoxyl, aryl, or heteroaryl; and substituent groups R₃ through R₁₂ are independently hydrogen, alkyl, alkoxyl, halogen, aryl, or heteroaryl, and adjacent substituent groups R₃ through R₁₀ can optionally be connected to form one or more ring systems, including fused aromatic and fused heteroaromatic rings, provided that the substituents are selected to provide an emission maximum between 510 nm and 540 nm. Alkyl, alkoxyl, aryl, heteroaryl, fused aromatic ring and fused heteroaromatic ring substituent groups can be further substituted. Some examples of useful quinacridones include those disclosed in U.S. Pat. No. 5,593,788 and in US2004/0001969A1.

Examples of useful quinacridone green dopants include:

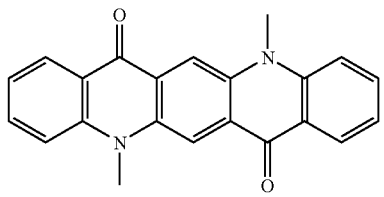

H1

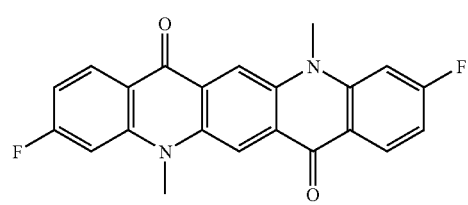

H2

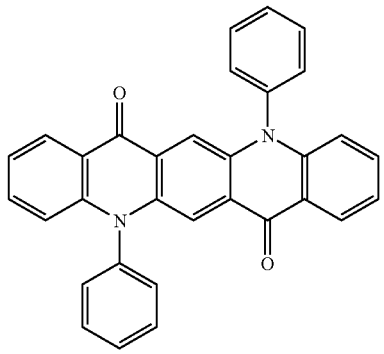

H3

A singlet green light-emitting dopant can also include a 2,6-diaminoanthracene light-emitting dopant, as represented by the formula below:

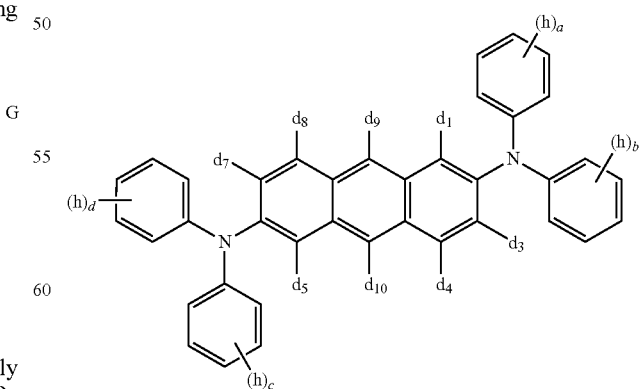

I wherein $d_1$, $d_3$-$d_5$, and $d_7$-$d_{10}$ can be the same or different and each represents hydrogen or an independently selected substituent, and each h can be the same or different and each represents one or more independently selected substituents, provided that two substituents can combine to form a ring group and a-d are independently 0-5.

Green light-emitting layer 52g can optionally include a small amount of a blue light-emitting compound as a stabilizer. The presence of a blue light-emitting compound, which is a higher-energy dopant, provides greater luminance stability to the green emission of 2,6-diaminoanthracene dopants, while maintaining good efficiency of the green light-emitting dopants. Blue light-emitting compounds can be those described below for blue light-emitting layers 50b and 51b.

A singlet red-light-emitting compound can be used in yellow light-emitting layer 52y and can include a diindenoperylene compound of the following structure J:

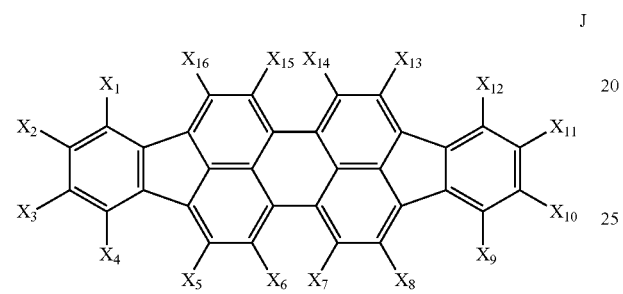

wherein:
$X_1$-$X_{16}$ are independently selected as hydrogen or substituents that include alkyl groups of from 1 to 24 carbon atoms; aryl or substituted aryl groups of from 5 to 20 carbon atoms; hydrocarbon groups containing 4 to 24 carbon atoms that complete one or more fused aromatic rings or ring systems; or halogen, provided that the substituents are selected to provide an emission maximum between 560 nm and 640 nm.

Illustrative examples of useful red dopants of this class are shown by Hatwar et al. in U.S. Pat. No. 7,247,394, the contents of which are incorporated by reference.

Other singlet red dopants useful in the present invention belong to the DCM class of dyes represented by Formula K:

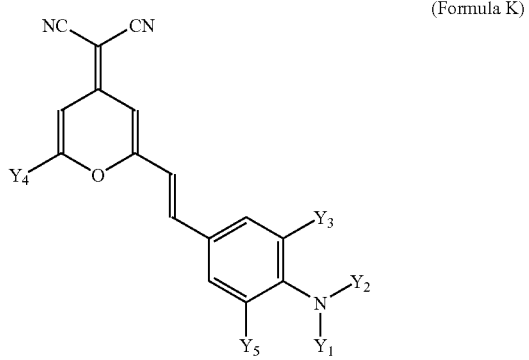

(Formula K)

wherein $Y_1$-$Y_5$ represent one or more groups independently selected from: hydro, alkyl, substituted alkyl, aryl, or substituted aryl; $Y_1$-$Y_5$ independently include acyclic groups or can be joined pairwise to form one or more fused rings; provided that $Y_3$ and $Y_5$ do not together form a fused ring.

In a useful and convenient embodiment that provides red luminescence, $Y_1$-$Y_5$ of Formula K are selected independently from: hydro, alkyl, and aryl. Structures of particularly useful dopants of the DCM class are shown by Ricks et al. in U.S. Pat. No. 7,252,893, the contents of which are incorporated by reference.

A singlet light-emitting yellow compound such as used in yellow light-emitting layer 52y can include a compound of the following structures:

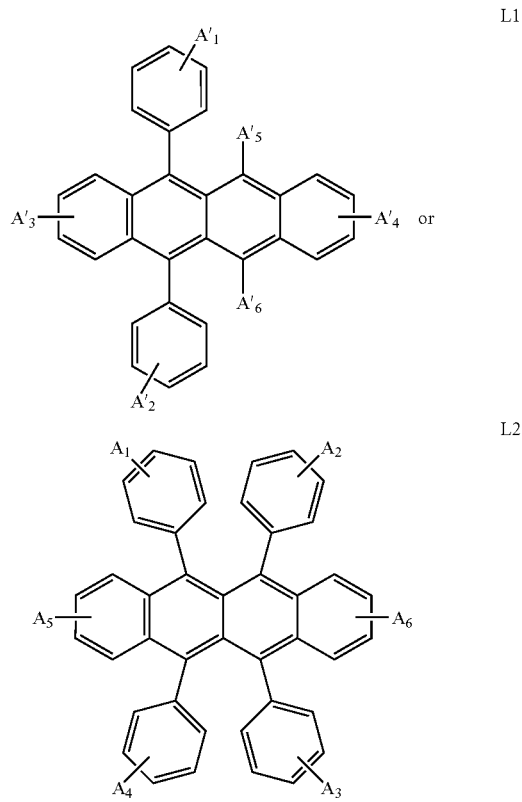

wherein $A_1$-$A_6$ and $A'_1$-$A'_{16}$ represent one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

Examples of particularly useful yellow dopants are shown by Ricks et al.

Another class of useful singlet yellow dopants are described in U.S. Pat. No. 6,818,327 and are according to formula L3:

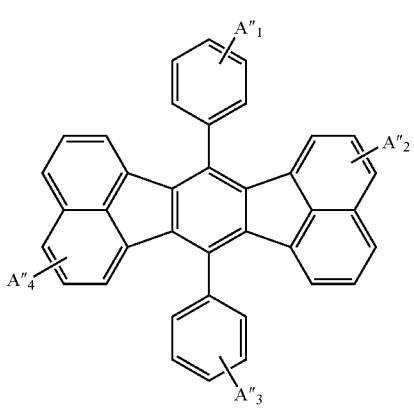

L3 wherein A"₁-A"₄ represent one or more substituents on each ring and where each substituent is individually selected from one of the following:
  Category 1: hydrogen, or alkyl of from 1 to 24 carbon atoms;
  Category 2: aryl or substituted aryl of from 5 to 20 carbon atoms;
  Category 3: hydrocarbon containing 4 to 24 carbon atoms, completing a fused aromatic ring or ring system;
  Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;
  Category 5: alkoxylamino, alkylamino, or arylamino of from 1 to 24 carbon atoms; or
  Category 6: fluoro, chloro, bromo or cyano.

Particularly useful examples are where A"₁ and A"₃ are hydrogen and A"₂ and A"₄ are chosen from category 5.

A blue-light-emitting dopant that can be used in blue light-emitting layers 50b and 51b can include a bis(azinyl)azene boron complex compound of the structure M:

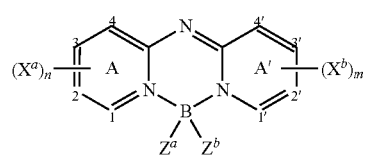

M wherein:
  A and A' represent independent azine ring systems corresponding to 6-membered aromatic ring systems containing at least one nitrogen;
  $(X^a)_n$ and $(X^b)_n$ represent one or more independently selected substituents and include acyclic substituents or are joined to form a ring fused to A or A';
  m and n are independently 0 to 4;
  $Z^a$ and $Z^b$ are independently selected substituents;
  1, 2, 3, 4, 1', 2', 3', and 4' are independently selected as either Xs carbon or nitrogen atoms; and
  provided that $X^a$, $X^b$, $Z^a$, and $Z^b$, 1, 2, 3, 4, 1', 2', 3', and 4' are selected to provide blue luminescence.

Some examples of the above class of dopants are disclosed by Ricks et al.,

Another class of singlet blue dopants is the perylene class. Particularly useful blue dopants of the perylene class include perylene and tetra-t-butylperylene (TBP).

Another particularly useful class of singlet blue dopants in this invention includes blue-emitting derivatives of such styrylarenes and distyrylarenes as distyrylbenzene, styrylbiphenyl, and distyrylbiphenyl, including compounds described in U.S. Pat. No. 5,121,029, and US Publication 2006/0093856 by Helber et al. Among such derivatives that provide blue luminescence, particularly useful are those substituted with diarylamino groups. Examples include bis[2-[4-[N,N-diarylamino]phenyl]vinyl]-benzenes of the general structure N1 shown below:

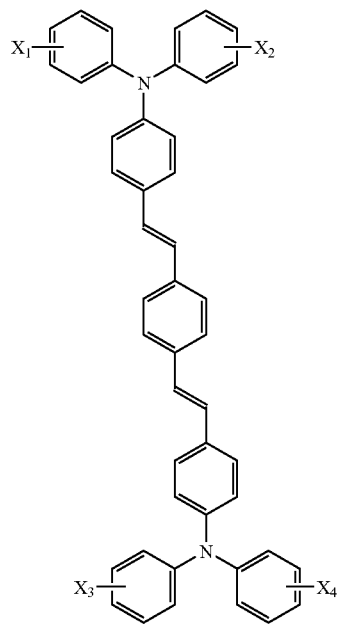

N1

[N,N-diarylamino][2-[4-[N,N-diarylamino]phenyl]vinyl]biphenyls of the general structure N2 shown below:

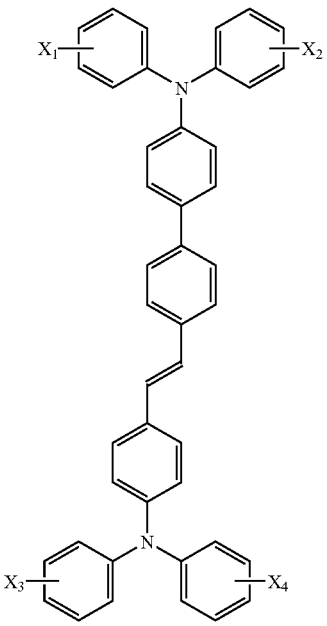

N2 and bis[2-[4-[N,N-diarylamino]phenyl]vinyl]biphenyls of the general structure N3 shown below:

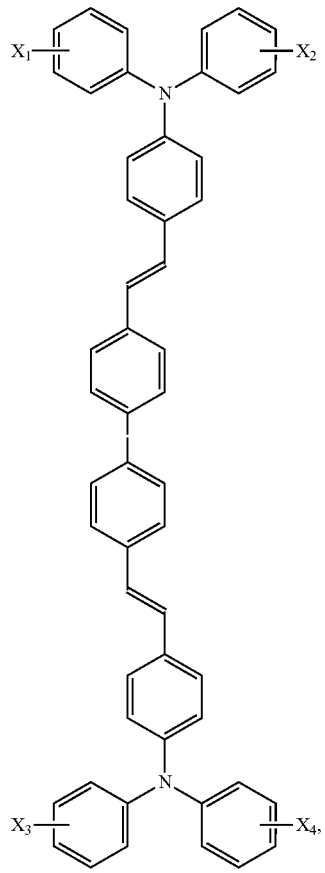

In Formulas N1 to N3, $X_1$-$X_4$ can be the same or different, and individually represent one or more substituents such as alkyl, aryl, fused aryl, halo, or cyano. In a preferred embodiment, $X_1$-$X_4$ are individually alkyl groups, each containing from one to about ten carbon atoms. A particularly preferred blue dopant of this class is disclosed by Ricks et al.

In addition to singlet light-emitting dopants, triplet light-emitting dopants can also be useful in the present invention, particularly in green light-emitting layer 52g and yellow light-emitting layer 52y. Triplet light-emitting dopants useful in this invention have been described by Deaton et al. in U.S. patent application Ser. No. 11/749,883 and U.S. patent application Ser. No. 11/749,899, the contents of which are herein incorporated by reference.

Other OLED device layers that can be used in this invention have been well described in the art, and OLED devices 10 and 15, and other such devices described herein, can include layers commonly used for such devices. OLED devices are commonly formed on a substrate, e.g. OLED substrate 20. Such substrates have been well-described in the art. A bottom electrode is formed over OLED substrate 20 and is most commonly configured as an anode 30, although the practice of this invention is not limited to this configuration. When EL emission is viewed through the anode, the anode should be transparent, or substantially transparent, to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, are used as the anode. For applications where EL emission is viewed only through the cathode electrode, the transmissive characteristics of the anode are immaterial and any conductive material can be used, regardless if it is transparent, opaque, or reflective. Example conductors for the present invention include, but are not limited to, gold, iridium, molybdenum, palladium, and platinum. Typical anode materials, transmissive or otherwise, have a work function no less than 4.0 eV. Desired anode materials can be deposited by any suitable process such as evaporation, sputtering, chemical vapor deposition, or electrochemical deposition. Anode materials can be patterned using well-known photolithographic processes.

Hole-transporting layer 40 can be formed and disposed over the anode. Other hole-transporting layers, e.g. 41 and 45, can be used with other light-emitting units, as described above. Desired hole-transporting materials can be deposited by any suitable process such as evaporation, sputtering, chemical vapor deposition, electrochemical deposition, thermal transfer, or laser thermal transfer from a donor material. Hole-transporting materials useful in hole-transporting layers include hole-transporting compounds described above as light-emitting hosts.

Electron-transporting layers, e.g. 55, 65, and 66, can contain one or more metal chelated oxinoid compounds, including chelates of oxine itself, also commonly referred to as 8-quinolinol or 8-hydroxyquinoline. Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, phenanthroline derivatives, and some silole derivatives are also useful electron-transporting materials.

An upper electrode most commonly configured as a cathode 90 is formed over the electron-transporting layer. If the device is top-emitting, the electrode must be transparent or nearly transparent. For such applications, metals must be thin (preferably less than 25 nm) or one must use transparent conductive oxides (e.g. indium-tin oxide, indium-zinc oxide), or a combination of these materials. Optically transparent cathodes have been described in more detail in U.S. Pat. No. 5,776,623. If the device is bottom-emitting, that is, where EL emission is viewed only through the anode electrode, the transmissive characteristics of the cathode are immaterial and any conductive material can be used. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

In OLED devices such as those described herein, one of the spaced electrodes is necessarily transmissive to visible light. The other electrode can be reflective. For example, in FIG. 2, the anodes are transmissive, while the cathode can be reflective. In such a structure, first light-emitting unit 85 is disposed closer to the reflective electrode than second and third light-emitting units 80 and 75. As described by Boroson et al. in US Publication 2007/0001588, it can be particularly useful to place a red-to-green light-emitting unit (e.g. first light-emitting unit 85) in the range of 60-90 nm from a reflecting electrode, and a blue light-emitting unit (e.g. second light-emitting unit 80) in the range of 150-200 nm from the reflecting electrode.

OLED devices 10 and 15 can include other layers as well. For example, a hole-injecting layer 35 can be formed over the anode, as described in U.S. Pat. Nos. 4,720,432, 6,208,075, EP 0 891 121 A1, and EP 1 029 909 A1. An electron-injecting layer, such as alkaline or alkaline earth metals, alkali halide salts, or alkaline or alkaline earth metal doped organic layers, can also be present between the cathode and the electron-transporting layer.

The invention and its advantages can be better appreciated by the following comparative examples. Examples 2 to 4 are representative examples of this invention, while Example 1 is a non-inventive tandem OLED example for comparison purposes. The layers described as vacuum-deposited were deposited by evaporation from heated boats under a vacuum of approximately $10^{-6}$ Torr. After deposition of the OLED layers each device was then transferred to a dry box for encapsulation. The OLED has an emission area of 10 mm². The devices were tested by applying a current of 20 mA/cm² across electrodes. The results from Examples 1 to 4 are given in Table 1.

EXAMPLE 1

Comparative

1. A clean glass substrate was deposited by sputtering with indium tin oxide (ITO) to form a transparent electrode of 60 nm thickness.
2. The above-prepared ITO surface was treated with a plasma oxygen etch.
3. The above-prepared substrate was further treated by vacuum-depositing a 1 nm layer of hexacyanohexaazatriphenylene (CHATP) as a hole-injecting layer (HIL).

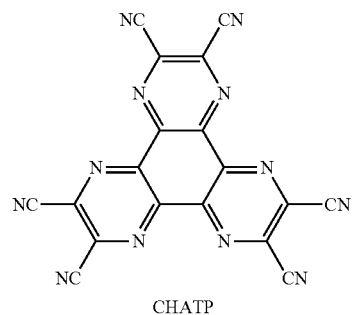
CHATP

4. The above-prepared substrate was further treated by vacuum-depositing a 130 nm layer of 4,4'-bis[N-(1-naphthyl)-N-phenylamino]biphenyl (NPB) as a hole-transporting layer (HTL).
5. The above-prepared substrate was further treated by vacuum-depositing a 20 nm yellow light-emitting layer including 48% NPB (as host) and 50% 9-(1-naphthyl)-10-(2-naphthyl)anthracene (NNA) as a co-host with 2% yellow-orange emitting dopant diphenyltetra-t-butylrubrene (PTBR).

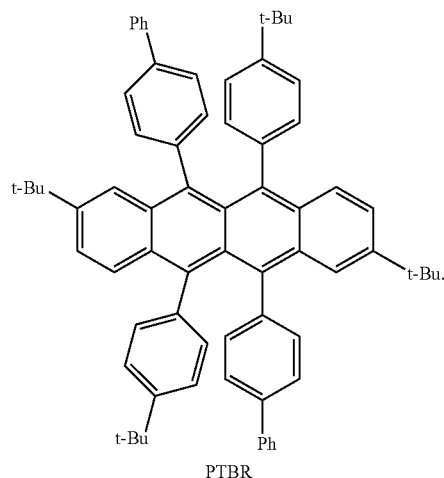
PTBR

6. The above-prepared substrate was further treated by vacuum-depositing a 20 nm blue light-emitting layer including 85% NNA host and 10% NPB co-host with 5% BED-1 as blue-emitting dopant.

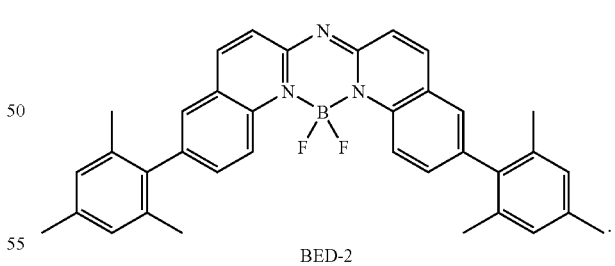
BED-1

7. The above-prepared substrate was further treated by vacuum-depositing a 20 nm blue light-emitting layer including 99% NNA host with 1% BED-2 as blue-emitting dopant.

BED-2

8. A 40 nm mixed electron-transporting layer was vacuum-deposited, including 49% 4,7-diphenyl-1,10-phenanthroline (also known as bathophen or Bphen), 49% tris(8-quinolinolato)aluminum (III) (ALQ) as co-host, with 2% Li metal.
9. The above-prepared substrate was further treated by vacuum-depositing a 10 nm layer of CHATP as a p-type doped organic layer (HIL).
10. The above-prepared substrate was further treated by vacuum-depositing a 5 nm layer of NPB as an HTL.

11. The above-prepared substrate was further treated by vacuum-depositing a 16 nm red light-emitting layer including 74.5% of NPB and 25% NNA as co-hosts with 0.5% dibenzo {[f,f']-4,4'7,7'-tetraphenyl]diindeno-[1,2,3-cd: 1',2',3'-lm]perylene (TPDBP) as a red emitting dopant.
12. The above-prepared substrate was further treated by vacuum-depositing a 4 nm yellow light-emitting layer including 23% NPB and 75% NNA as co-hosts with 2% PTBR.
13. The above-prepared substrate was further treated by vacuum-depositing a 40 nm green light-emitting layer including 94% 2-phenyl-9,10-bis(2-naphthyl)anthracene (PBNA) as host with 5% 2,6-bis(diphenylamino)-9,10-diphenylanthracene as green emitting dopant, and 1% BED-2 as blue-emitting dopant.
14. A 40 nm mixed electron-transporting layer was vacuum-deposited, including 49% Bphen and 49% ALQ as co-hosts, with 2% Li metal.
15. A 100 nm layer of aluminum was evaporatively deposited onto the substrate to form a cathode layer.

EXAMPLE 2

Inventive

1. A clean glass substrate was deposited by sputtering with indium tin oxide (ITO) to form a transparent electrode of 60 nm thickness.
2. The above-prepared ITO surface was treated with a plasma oxygen etch.
3. The above-prepared substrate was further treated by vacuum-depositing a 10 nm layer of CHATP as a hole-injecting layer (HIL).
4. The above-prepared substrate was further treated by vacuum-depositing a 163 nm layer of NPB as an HTL.
5. The above-prepared substrate was further treated by vacuum-depositing a 30 nm blue light-emitting layer including 95% NNA host with 5% BED-1 as blue-emitting dopant.
6. A 40 nm mixed electron-transporting layer was vacuum-deposited, including 49% Bphen and 49% (8-quinolinolato)lithium (LiQ) as co-hosts, with 2% Li metal.
7. The above-prepared substrate was further treated by vacuum-depositing a 10 nm layer of CHATP as a p-type doped organic layer (HIL).
8. The above-prepared substrate was further treated by vacuum-depositing a 60 nm layer of NPB as an HTL.
9. The above-prepared substrate was further treated by vacuum-depositing a 30 nm blue light-emitting layer including 95% NNA host with 5% BED-1 as blue-emitting dopant.
10. A 40 nm mixed electron-transporting layer was vacuum-deposited, including 49% Bphen and 49% LiQ as co-hosts, with 2% Li metal.
11. The above-prepared substrate was further treated by vacuum-depositing a 10 nm layer of CHATP as a p-type doped organic layer (HIL).
12. The above-prepared substrate was further treated by vacuum-depositing a 11 nm layer of NPB as an HTL.
13. The above-prepared substrate was further treated by vacuum-depositing a 20 nm yellow light-emitting layer including 97% NPB as host with 3% PTBR.
14. The above-prepared substrate was further treated by vacuum-depositing a 40 nm green light-emitting layer including 95% PBNA as host with 5% 2,6-bis(diphenylamino)-9,10-diphenylanthracene as green emitting dopant.
15. A 34 nm mixed electron-transporting layer was vacuum-deposited, including 49% Bphen and 49% LiQ as co-hosts, with 2% Li metal.
16. A 100 nm layer of aluminum was evaporatively deposited onto the substrate to form a cathode layer.

EXAMPLE 3

Inventive

An OLED device was constructed as described above for Example 2 except that the hole-transporting layer thicknesses were varied as follows:
4. The above-prepared substrate was further treated by vacuum-depositing a 200 nm layer of NPB as an HTL.
8. The above-prepared substrate was further treated by vacuum-depositing a 10 nm layer of NPB as an HTL.
12. The above-prepared substrate was further treated by vacuum-depositing a 20 nm layer of NPB as an HTL.

EXAMPLE 4

Inventive

An OLED device was constructed as described above for Example 2 except that the hole-transporting layer thicknesses were varied as follows:
4. The above-prepared substrate was further treated by vacuum-depositing a 10 nm layer of NPB as an HTL.
8. The above-prepared substrate was further treated by vacuum-depositing a 38 nm layer of NPB as an HTL.
12. The above-prepared substrate was further treated by vacuum-depositing a 25 nm layer of NPB as an HTL.

The results of these examples are shown in Table 1, below.

TABLE 1

Device data measured at 20 mA/cm$^2$

| Device # | Voltage | Lum Efficiency (cd/A) | CIEx | CIEy | QE % | Correlated Color Temperature |
|---|---|---|---|---|---|---|
| Example 1 (Comparative) | 9.1 | 22.5 | 0.321 | 0.351 | 9.7 | 6,000 K |
| Example 2 (Inventive) | 11.2 | 37.6 | 0.241 | 0.279 | 18.5 | 15,000 K |
| Example 3 (Inventive) | 11.1 | 34.0 | 0.254 | 0.279 | 16.1 | 15,000 K |
| Example 4 (Inventive) | 10.2 | 36.3 | 0.257 | 0.290 | 17.3 | 10,000 K |

Table 1 shows that higher color temperatures can be obtained with a display in accordance with this invention. The inventive examples show color temperatures in the desirable range of 9,000K to 13,000K. The inventive examples also show improved efficiency, with only a slight (1 to 2 volt) increase in driving voltage.

Figure 3:
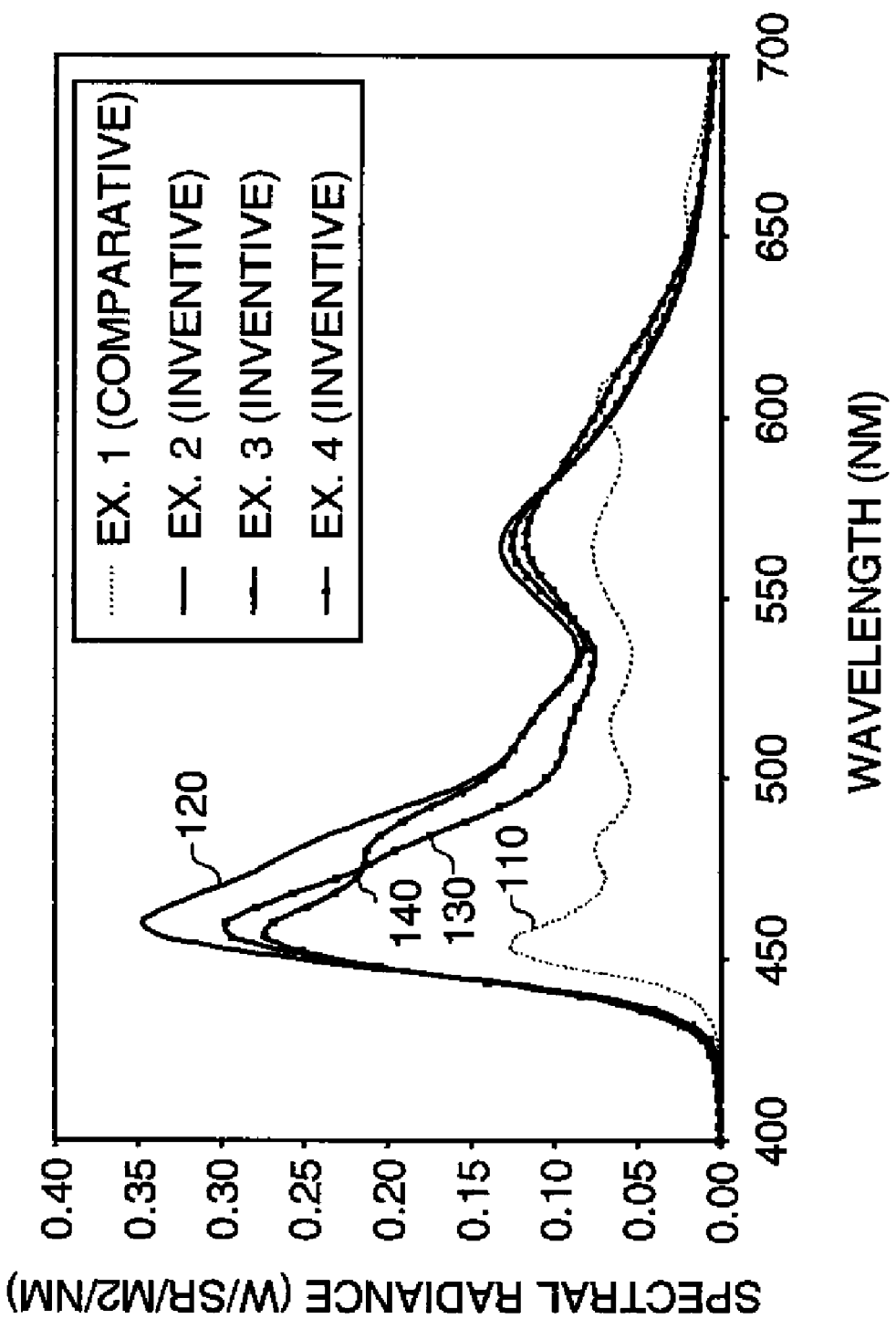
FIG. 3 shows a graph of spectral radiance vs. wavelength for several embodiments of this invention.

FIG. 3, which shows spectral radiance vs. wavelength for the above examples, shows this further. Curve 110 shows the spectral radiance for comparative Example 1. In comparison, inventive Examples 2, 3, and 4 (curves 120, 130, and 140, respectively) show improved luminance overall, but most especially in the blue region of the spectrum. The color temperatures of Examples 2 to 4 are much higher than that of Example 1.

Examples 5 and 6 are some additional examples of this type of structure. The results for Examples 5 and 6 are given in Table 2.

EXAMPLE 5

Comparative

1. A clean glass substrate was deposited by sputtering with indium tin oxide (ITO) to form a transparent electrode of 60 nm thickness.
2. The above-prepared ITO surface was treated with a plasma oxygen etch.
3. The above-prepared substrate was further treated by vacuum-depositing a 10 nm layer of CHATP as a hole-injecting layer (HL).
4. The above-prepared substrate was further treated by vacuum-depositing a 163 nm layer of NPB as an HTL.
5. The above-prepared substrate was further treated by vacuum-depositing a 20 nm blue light-emitting layer including 99% NNA host with 1% BED-2 as blue-emitting dopant.
6. A 50 nm mixed electron-transporting layer was vacuum-deposited, including 49% Bphen and 49% (8-quinolinolato)lithium (LiQ) as co-hosts, with 2% Li metal.
7. The above-prepared substrate was further treated by vacuum-depositing a 10 nm layer of CHATP as a p-type doped organic layer (HIL).
8. The above-prepared substrate was further treated by vacuum-depositing a 60 nm layer of NPB as an HTL.
9. The above-prepared substrate was further treated by vacuum-depositing a 20 nm blue light-emitting layer including 99% NNA host with 1% BED-2 as blue-emitting dopant.
10. A 50 nm mixed electron-transporting layer was vacuum-deposited, including 49% Bphen and 49% LiQ as co-hosts, with 2% Li metal.
11. The above-prepared substrate was further treated by vacuum-depositing a 10 nm layer of CHATP as a p-type doped organic layer (HIL).
12. The above-prepared substrate was further treated by vacuum-depositing a 11 nm layer of NPB as an HTL.
13. A 10 nm electron-blocking layer (EBL) of 4,4',4"-tris-(N-carbazolyl)triphenylamine (TCTA) was then deposited onto the hole-transporting layer by evaporation from a tantalum boat.
14. A 10 nm electron-blocking layer of dicarbazolebiphenyl (CBP) was vacuum-deposited onto the device.
15. The above-prepared substrate was further treated by vacuum-depositing a 35 nm yellow light-emitting layer including 76% Triplet Host 1 (TH-1) and 15% CBP with 13% Ir(cou)ppy$_2$ as a triplet yellow emitting compound.

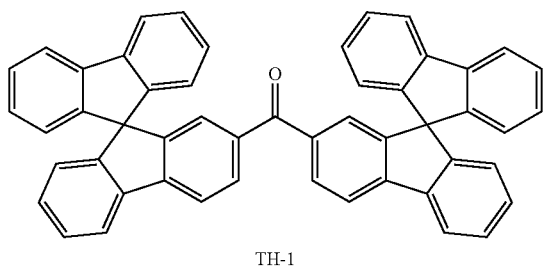

TH-1

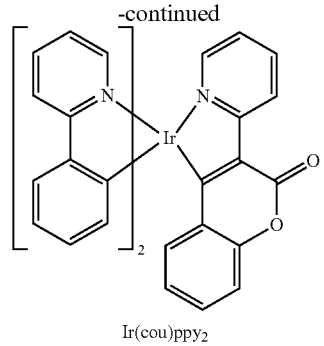

Ir(cou)ppy$_2$

16. The above-prepared substrate was further treated by vacuum-depositing a 10 nm layer of TH-1.
17. A 30 nm mixed electron-transporting layer was vacuum-deposited, including 50% Bphen and 50% Electron-Transporting Material 1 (ETM-1).

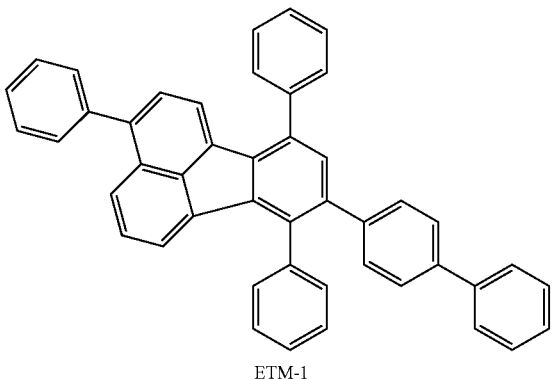

ETM-1

18. A 0.5 nm electron-injecting layer of LiF was vacuum-deposited on the above-treated substrate.
19. A 100 nm layer of aluminum was evaporatively deposited onto the substrate to form a cathode layer.

EXAMPLE 6

Comparative

An OLED device was constructed as described above for Example 5 except that the hole-transporting layer thicknesses were varied as follows:
 4. The above-prepared substrate was further treated by vacuum-depositing a 10 nm layer of NPB as an HTL.
 8. The above-prepared substrate was further treated by vacuum-depositing a 38 nm layer of NPB as an HTL.
 12. The above-prepared substrate was further treated by vacuum-depositing a 25 nm layer of NPB as an HTL.

The results of these examples are shown in Table 2, below.

TABLE 2

| | Device data measured at 1 mA/cm$^2$ | | | | | |
|---|---|---|---|---|---|---|
| Device # | Voltage | Lum Efficiency (cd/A) | CIEx | CIEy | QE % | Correlated Color Temperature |
| Example 5 (Comparative) | 9.7 | 72.8 | 0.345 | 0.368 | 27.9 | 5,000 K |

TABLE 2-continued

Device data measured at 1 mA/cm²

| Device # | Voltage | Lum Efficiency (cd/A) | CIEx | CIEy | QE % | Correlated Color Temperature |
|---|---|---|---|---|---|---|
| Example 6 (Comparative) | 9.6 | 72.1 | 0.360 | 0.380 | 26.9 | 4,600 K |

Examples 5 and 6 show OLED devices of the structure described herein that do not have emission with color temperature greater than 7,000K. Thus, it is necessary to also select the layers to have the desired color temperature for emission. It is conceivable that if higher-efficiency blue-emitting units are used in this embodiment of the invention, then color temperatures greater than 7,000K and high efficiency would be obtained.

The invention has been described in detail with particular reference to certain preferred embodiments thereof, but it will be understood that variations and modifications can be effected within the spirit and scope of the invention.

PARTS LIST

10 OLED device
15 OLED device
20 substrate
25r red color filter
25g green color filter
25b blue color filter
30 anode
31r anode
31g anode
31b anode
31w anode
35 hole-injecting layer
40 hole-transporting layer
41 hole-transporting layer
45 hole-transporting layer
50b blue light-emitting layer
51b blue light-emitting layer
52y yellow light-emitting layer
52g green light-emitting layer
55 electron-transporting layer
65 electron-transporting layer
66 electron-transporting layer
75 light-emitting unit
80 light-emitting unit
85 light-emitting unit
90 cathode
95 intermediate connector
96 intermediate connector
110 curve
120 curve
130 curve
140 curve

The invention claimed is:

1. An OLED device having two spaced electrodes comprising:
   a. first, second, and third light-emitting units disposed between the electrodes, the first light-emitting unit produces light that has multiple peaks at wavelengths longer than 500 nm and substantially no emission at wavelengths shorter than 480 nm, and the second and third light-emitting units produce light that has substantial emission at wavelengths shorter than 500 nm;
   b. intermediate connectors respectively disposed between the first and second light-emitting units, and between the second and third light-emitting units; and
   c. wherein the OLED device emits light with a color temperature greater than 7,000K.

2. The OLED device of claim 1 wherein the device emits light with a color temperature between 9,000K and 13,000K.

3. The OLED device of claim 1 wherein the second and third light-emitting units each include a light-emitting layer comprising a host material and a blue-light-emitting dopant.

4. The OLED device of claim 3 wherein the blue light-emitting dopant is a singlet light-emitting compound.

5. The OLED device of claim 3 wherein the blue light-emitting dopant is a triplet light-emitting compound.

6. The OLED device of claim 1 wherein the first light-emitting unit includes a singlet light-emitting compound.

7. The OLED device of claim 1 wherein the first light-emitting unit includes a triplet light-emitting compound.

8. The OLED device of claim 1 wherein the second and third light-emitting units have the same emission spectra.

9. The OLED device of claim 1 wherein the second and third light-emitting units have different emission spectra.

10. The OLED device of claim 1 wherein one of the spaced electrodes is reflective and the other is transmissive and the first light-emitting unit is disposed closer to the reflective electrode than the second and third light-emitting units.

11. The OLED device of claim 1 further including an array of at least three different color filters associated with the device that receives light from the light-emitting units, the bandpass of each of the color filters being selected to produce different colored light.

12. The OLED device of claim 11 wherein the array of at least three different color filters forms an RGBW device.

* * * * *